June 20, 1967 K. P. GRABOWSKI 3,327,240

VOLTAGE TUNABLE TUNNEL DIODE MICROWAVE AMPLIFIER

Filed Dec. 30, 1963

Kenneth P. Grabowski,
INVENTOR.
BY.
Paul M. Cobb
ATTORNEY.

3,327,240
VOLTAGE TUNABLE TUNNEL DIODE MICROWAVE AMPLIFIER

Kenneth P. Grabowski, La Mirada, Calif., assignor to Hughes Aircraft Company, Culver City, Calif., a corporation of Delaware Filed Dec. 30, 1963, Ser. No. 334,540
2 Claims. (Cl. 330—61)

ABSTRACT OF THE DISCLOSURE

The disclosed voltage tunable microwave amplifier includes a negative resistance providing tunnel diode connected across a terminated strip transmission line having a quarter wavelength extension stub functioning as a rejection filter. By varying the bias voltage applied to a varacter diode connected across the end of the extension stub, the center frequency of the filter, hence of the amplifier, may be varied electrically.

Figure 1:
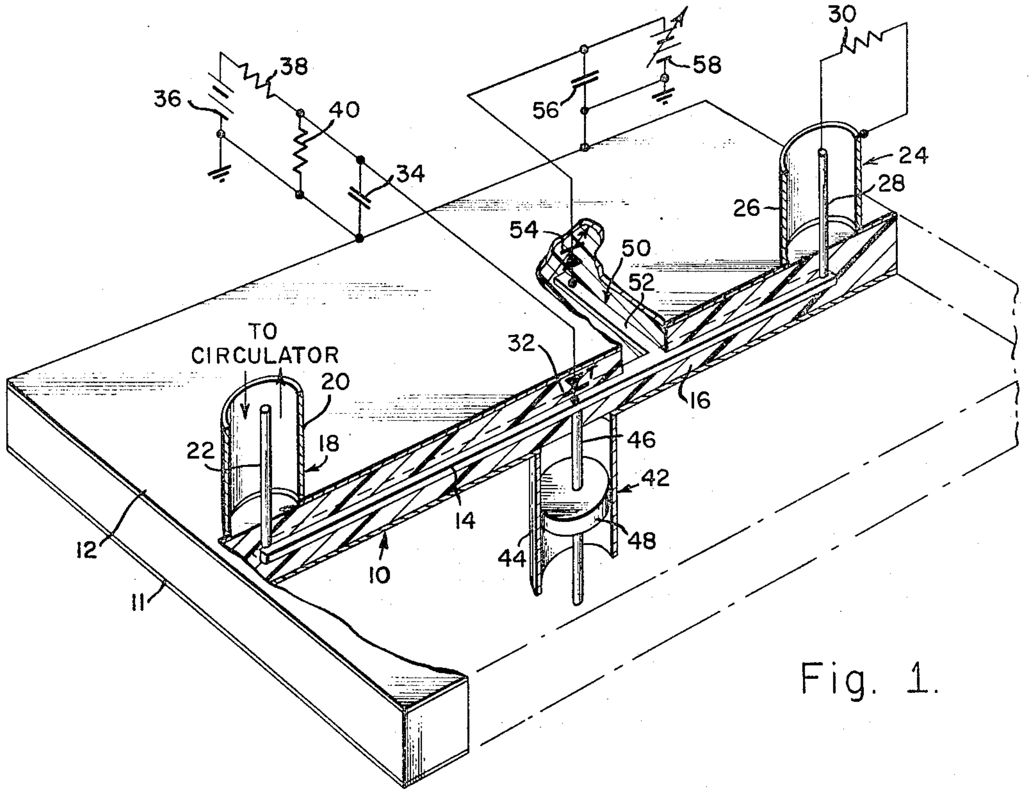

The present invention relates to microwave devices, and more particularly relates to a narrow band tunnel diode microwave amplifier which is voltage tunable over a wide frequency range.

In the prior art, electronic tuning of tunnel diode amplifiers was accomplished by changing the bias voltage applied to the tunnel diode. Since only one bias voltage provides a minimum noise figure for such a circuit, when the bias voltage deviates from its optimum value, the noise figure of the circuit is increased, thereby precluding low noise operation over a wide frequency range. In addition, maximum gain is achieved over a very small range of bias voltages so that a change in bias voltage to a value out of this range is accompanied by a substantial reduction in gain.

Accordingly, it is an object of the present invention to provide a narrow band tunnel diode amplifier which is electronically tunable over a relatively wide frequency range.

It is a further object of the present invention to provide a narrow band voltage tunable tunnel diode microwave amplifier having a low noise figure which is not degraded as the center frequency of the amplifier is changed.

It is a still further object of the present invention to provide a narrow band voltage tunable tunnel diode microwave amplifier having a substantially constant gain over a wide range of center frequencies.

It is still another object of the present invention to provide a narrow band electronically tunable tunnel diode amplifier which inherently acts to suppress undesired oscillations outside of the amplifier passband.

It is a still further object of the present invention to provide a narrow band tunnel diode oscillator which is electronically tunable over a relatively wide frequency range.

It is yet another object of the present invention to provide a readily and rapidly tunable tunnel diode amplifier or oscillator which, in addition to possessing the advantages set forth above, is simple, small and inexpensive.

In accordance with the objects given above, the amplifier of the present invention includes a terminated transmission line and means such as a tunnel diode for providing a negative resistance at a predetermined region along the transmission line. A rejection filter is coupled to the transmission line between the region of coupling to the tunnel diode and the terminating impedance. The rejection filter includes a varactor diode, and by applying a variable voltage to the varactor its capacitance may be varied to electronically change the resonant frequency of the rejection filter and thereby afford voltage tuning of the amplifier. In a preferred embodiment of the invention narrow strips of electrically conductive material are employed as a wave-guiding element in both the transmission line and in the rejection filter. By making the characteristic resistance of the transmission line substantially equal in magnitude to the negative resistance of the tunnel diode, a voltage tunable oscillator may be provided.

Figure 2:
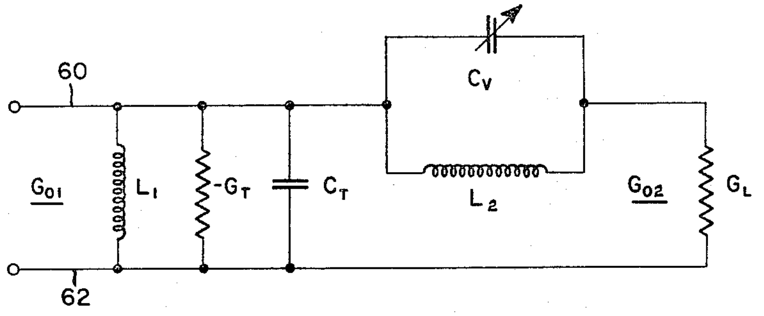

Other and further objects, advantages and characteristic features of the invention will become readily apparent from the following detailed description of preferred embodiments of the invention when taken in conjunction with the appended drawings in which:

FIG. 1 is a perspective view, partially broken away into section and partially in schematic circuit form, of an amplifier according to the present invention; and FIG. 2 is a schematic circuit diagram illustrating an equivalent circuit for the amplifier of FIG. 1.

Referring now to FIG. 1 with greater particularity, there is shown a microwave amplifier including a strip transmission line arrangement 10. The transmission line 10 comprises a pair of electrically conductive parallel plates 11 and 12, of copper or aluminum for example, and a narrow electrically conductive strip 14, which may also be of copper or aluminum, equidistantly mounted between the plates 11 and 12. The strip 14 is supported by and electrically insulated from the planar conductors 11 and 12 by means of insulating material 16 such as Teflon.

In order to provide an input-output port for the amplifier a coaxial transmission line 18 comprising a tubular outer conductor 20 and an inner conductive rod 22 is provided at one end of the strip transmission line 10. The outer conductor 20 is electrically connected to the conductive plate 12, while the inner rod 22 electrically connects with the conductive center strip 14 of the transmission line 10. The end of the input-output coaxial line 18 electrically remote from the strip transmission line 10 is connected to a circulator (not shown) for separating the input and output signals. At the opposite end of the strip transmission line 10 there is provided a second coaxial transmission line 24 which comprises a tubular outer conductor 26 electrically connected to the planar conductor 12 and an inner conductive rod 28 electrically connected to the conductive strip 14. A dissipative load, such as a terminating resistor 30, providing an impedance substantially equal ot the characteristic impedance of the transmission line 10 is connected between the conductors 26 and 28. Alternatively, lossy material could be disposed along the transmission line 10 in lieu of the coaxial line 24 and the resistor 30 in order to terminate the strip transmission line 10. The conductive plates 11 and 12 of the transmission line 10 may be electrically connected to a level of reference potential illustrated as ground in FIG. 1.

A negative resistance element such as a tunnel diode 32 is electrically coupled between the conductive strip 14 and the planar conductor 12 at a predetermined location along the strip transmission line. As shown, the cathode of the tunnel diode 32 is connected to the strip 14, with the anode being connected to the plate 12 through a DC isolating capacitor 34. The tunnel diode 32 is biased to operate in its negative resistance region by means of a source of DC potential illustrated as a battery 36 having its negative terminal connected to the conductor 12 and its positive terminal connected via a resistor 38 to the anode of the tunnel diode 32. A resistor 40 is connected in parallel with the capacitor 34 in order to present a sufficiently low impedance to the tunnel diode 32 to prevent oscillations in its bias circuit. It will be appreciated that the polarity of the tunnel diode 32 may be reversed from that shown, in which case the polarity of the potential source 36 would also be reversed.

In addition to providing a negative resistance between the conductors 12 and 14, the tunnel diode 32 furnishes a capacitance in parallel with its negative resistance. Since this capacitance may limit the gain attainable, it is desirable to provide an inductance in parallel with the tunnel diode capacitance and of a value which effectively cancels this capacitance. For this purpose a third coaxial transmission line 42 having a tubular outer conductor 44 and an inner conductive rod 46 is connected to the strip transmission line 10 adjacent the tunnel diode 32, with the rod 46 being electrically connected to the strip 14 and the tube 44 connected to the conductive plate 11. A tuning stub, such as a slidable short-circuiting disc 48, is provided in the coaxial line 42 in order to vary the electrical length of the line 42, which in order to furnish the desired inductance should be less than one quarter wavelength for signals at the center frequency of the amplifier.

A rejection filter 50 is coupled to the strip transmission line 10 between the tunnel diode 32 and the terminated coaxial line 24. The rejection filter 50 may take the form of a narrow electrically conductive strip 52 projecting outwardly from the conductive strip 14 in a direction perpendicular to the length of the strip 14. The conductive strip 52 is supported by the insulator material 16 and is disposed parallel to and equidistant from the conductive plates 11 and 12. The length of the rejection filter strip 52 and the distance between its junction with the strip 14 and the tunnel diode 32 are both made essentially equal to one quarter wavelength for signals at the center frequency of the amplifier.

In order to vary the electrical length of the rejection filter 50 and thereby change the center frequency of the amplifier, a variable reactance element such as a high Q varactor diode 54 is coupled between the planar conductor 12 and the strip 52 near the end of the strip 52 remote from its junction with the strip 14. As shown, the anode of the varactor diode 54 is connected to the strip 52, with a DC isolating capacitor 56 connected between the cathode of the varactor 54 and the conductive plate 12. A source 58 of variable DC potential is connected across the capacitor 56 to provide a variable bias voltage for the varactor diode 54. As is well known, a varactor diode provides a capacitance which varies as a function of the voltage applied across the diode, and hence, by varying the potential provided by the source 58 the capacitive reactance of the rejection stub 50 can be readily varied. It is pointed out that the polarity of the varactor diode 54 may be reversed from that shown in FIG. 1, in which case the polarity of the bias source 58 would also be reversed. It should also be apparent that the variable potential source 58 need not be an independent source as shown, but rather may represent any variable DC signal which, for example, may be furnished from another portion of the overall system in which the circuit of FIG. 1 is incorporated.

An equivalent circuit for the amplifier of FIG. 1 is given by the schematic circuit diagram of FIG. 2. In this figure the strip transmission line 10 is depicted by the leads 60 and 62 and is indicated to have a characteristic conductance of $G_{01}$ between the input-output line 18 and the tunnel diode 32. The tunnel diode 32 provides a negative resistance of a value equal to the reciprocal of the conductance designated $-G_T$ and a parallel capacitance $C_T$ connected between the leads 60 and 62. The inductance introduced by the coaxial transmission line 42 is designated by $L_1$. The rejection filter 50 is represented by an inductance $L_2$ in parallel with a variable capacitance $C_v$ furnished by the varactor diode 54. The portion of the strip transmission line 10 located between the tunnel diode 32 and the terminated coaxial line 24 is indicated as having a characteristic conductance $G_{02}$, while the conductance $G_L$ represents the reciprocal resistance of the load resistor 30.

In the operation of the amplifier of the present invention, input microwave energy to be amplified is applied through a circulator to the input-output coaxial line 18 from which it is launched onto the strip transmission line 10. Assume first that the bias voltage applied to the varactor diode 54 is such that the effective electrical length of the rejection filter 50 is equal to one quarter wavelength at the center frequency of the wave energy launched onto the strip transmission line 10 and the wave energy traversing the strip transmission line is of frequencies close to this center frequency. For these frequencies the rejection filter 50 provides a parallel resonance of its capacitance $C_v$ and inductance $L_2$, creating a sufficiently large impedance to effectively disconnect the line conductance $G_{02}$ and the load conductance $G_L$ from the remainder of the circuit. In this condition the power gain of the amplifier, which is given by the absolute value of the reflection coefficient Γ squared, is:

$$\Gamma_{01}^2=\left|\frac{G_{01}+G_T}{G_{01}-G_T}\right|^2 \quad (1)$$

It will be observed from Equation 1 that the additive effect of the strip transmission line characteristic conductance $G_{01}$ and the tunnel diode conductance $G_T$ in the numerator and the subtractive effect of these components in the denominator enables substantial power gain to be achieved for wave energy of frequencies in the vicinity of the center frequency of the amplifier. This amplified energy is removed from the circuit via the input-output port 18 and the circulator (not shown).

When the frequency of the wave energy traversing the strip transmission line 10 is substantially different from the aforementioned center frequency to which the rejection filter 50 is tuned, the effective electrical length of the filter 50 departs from one quarter wavelength for the energy traversing the strip transmission line, and $C_v$ and $L_2$ are no longer in resonance. The impedance now presented by these components is sufficiently small so that the load conductance $G_L$ is effectively coupled to the remainder of the circuit, and the characteristic conductance $G_{02}$ of the portion of the strip transmission line between the tunnel diode 32 and the terminated line 24 has a substantial effect on the conductance appearing between the input terminals of the circuit. The power gain of the amplifier in this condition becomes:

$$\Gamma_{02}^2=\left|\frac{G_{01}+G_T-G_{02}}{G_{01}-G_T+G_{02}}\right|^2 \quad (2)$$

Inspection of Equation 2 reveals that the characteristic conductance $G_{02}$ reduces the numerator and increases the denominator from the values which they would have were the $G_{02}$ term not included, and accordingly the power gain is reduced from its value in Equation 1. In fact, as $G_{02}$ is made to approach $(G_{01}+G_T)$, the power gain tends toward zero. Thus, amplification is not achieved for frequencies substantially different from the frequency to which the rejection filter 50 is tuned.

By varying the bias applied to the varactor diode 54, the capacitance $C_v$ is varied, and the resonant frequency of the filter 50 is changed accordingly. Hence, the frequency for which gain is achievable may be varied electronically to tune the center frequency of the amplifier over a relatively wide frequency range. Since the frequency response may be shifted without changing the bias voltage on the tunnel diode 32, the tunnel diode bias may be preset at its optimum value from either a maximum gain or a minimum noise standpoint, permitting low noise operation and a substantially constant maximum gain over a wide range of center frequencies. In addition, since the network provides insertion loss (Equation 2) for frequencies other than those frequencies in the vicinity of the resonant frequency of the filter 50, spurious oscillations at frequencies outside of the amplifier passband are inherently suppressed on account of attenuation of these unwanted frequencies. Also, the circuit provides a rapid transition from gain to lossy conditions as a function of frequency, and hence a narrow band response is achieved, with the narrower the strip 52 and the higher the Q of the varactor diode 54, the narrower the bandwidth of the circuit.

A narrow band voltage tunable tunnel diode amplifier constructed in accordance with the principles of the present invention has been found to provide amplification with an average gain of 26 db and an average 3 db bandwidth of 10 mc. The amplifier was tunable from 2.5 gc. to 3.2 gc. with a 5 volt variation in varactor bias.

It should be appreciated that the principles of the present invention may be employed to provide oscillator circuits as well as amplifiers. Thus, the device of FIG. 1 may function as an oscillator by making the characteristic conductance $G_{01}$ of the strip transmission line 10 equal to the magnitude of the tunnel diode negative conductance $-G_T$ in order to achieve a theoretically infinite gain (see Equation 1) and thereby sustain oscillations. The frequency of the oscillations is determined by the resonant frequency of the rejection filter 50 as controlled by the variable bias applied to the varactor diode 54.

Thus, although the present invention has been shown and described with reference to particular embodiments, nevertheless various changes and modifications obvious to those skilled in the art to which the invention pertains are deemed to lie within the spirit and scope of the invention as set forth in the appended claims.

What is claimed is:

1. A voltage tunable microwave amplifier comprising: first and second parallel electrically conductive plates, a first electrically conductive strip disposed between and parallel to said plates, said first and second plates being electrically connected together and electrically insulated from said first conductive strip, first coaxial transmission line means having an outer conductor coupled to one of said plates and an inner conductor coupled to one end of said first conductive strip, second coaxial transmission line means having an outer conductor coupled to one of said plates and an inner conductor coupled to the other end of said first conductive strip, a resistive load coupled between the inner and outer conductors of said second coaxial transmission line means, a tunnel diode coupled between said first conductive strip and one of said plates at a predetermined location along said first conductive strip, a second electrically conductive strip connected to said first conductive strip between said second coaxial transmission line means and said tunnel diode, said second conductive strip extending outwardly from said first conductive strip in a plane parallel to said first and second plates and being electrically insulated therefrom, a varactor diode coupled between said second conductive strip and one of said plates at a predetermined location along said second conductive strip, and means for applying an electronically variable voltage to said varactor diode.

2. A voltage tunable microwave amplifier comprising: first and second electrically conductive plates disposed parallel to one another with insulator material disposed between said plates, a first electrically conductive strip substantially narrower than said first and second plates supported by said insulator material equidistant from said first and second plates and being disposed parallel to said plates, said first and second plates being electrically connected together, a first coaxial transmission line having an outer conductor coupled to one of said plates and an inner conductor coupled to one end of said first conductive strip, a second coaxial transmission line having an outer conductor coupled to one of said plates and an inner conductor coupled to the other end of said first conductive strip, a resistive load coupled between the inner and outer conductors of said second coaxial transmission line, a third coaxial transmission line having an outer conductor coupled to said first plate and an inner conductor coupled to said conductive strip at a predetermined location therealong, a movable electrically conductive element disposed in said third coaxial transmission line and electrically interconnecting the inner and outer conductors thereof, a tunnel diode coupled between said first conductive strip and said second plate at a region adjacent the region of coupling of said first conductive strip to the inner conductor of said third coaxial transmission line, means for biasing said tunnel diode to a negative resistance condition of operation, a second electrically conductive strip substantially narrower than said first and second plates connected to said first conductive strip between said second coaxial transmission line and said tunnel diode, said second electrically conductive strip being supported by said insulator material and extending outwardly from said first conductive strip in a direction perpendicular to the length of said first conductive strip and in a plane parallel to said first and second plates, the distance along said first conductive strip between said tunnel diode and said second conductive strip being essentially equal to one quarter wavelength corresponding to a predetermined frequency within the frequency passband of wave energy capable of propagating along said first conductive strip between said first and second plates, a varactor diode coupled between said second conductive strip and one of said plates at a predetermined location along said second conductive strip, the distance along said second conductive strip between said varactor diode and said first conductive strip being essentially equal to one quarter wavelength corresponding to said predetermined frequency, and means for applying an electronically variable voltage to said varactor diode.

References Cited

UNITED STATES PATENTS

| | | | |
|---|---|---|---|
| 3,141,141 | 7/1964 | Sharpless | 331—107 |
| 3,160,826 | 12/1964 | Marcatili | 330—34 X |
| 3,187,266 | 6/1965 | Marshall | 330—61 |

ROY LAKE, *Primary Examiner.*

NATHAN KAUFMAN, *Examiner.*